United States Patent [19]

Berman et al.

[11] Patent Number: 4,663,495

[45] Date of Patent: May 5, 1987

[54] TRANSPARENT PHOTOVOLTAIC MODULE

[75] Inventors: Elliot Berman, Los Angeles; Charles F. Gay, Northridge; Stephen C. Miller, Simi Valley; David P. Tanner, Thousand Oaks, all of Calif.

[73] Assignee: Atlantic Richfield Company, Los Angeles, Calif.

[21] Appl. No.: 741,080

[22] Filed: Jun. 4, 1985

[51] Int. Cl.[4] .................. F24J 3/02; H01L 31/06; H01L 27/14
[52] U.S. Cl. .................... 136/248; 136/244; 136/246; 136/249; 136/256; 136/258; 136/259; 29/572; 427/74; 52/173 R; 180/2.2; 180/65.3; 114/201 R
[58] Field of Search ........ 136/244, 246, 248, 249 MS, 136/257, 256, 258 AM, 259, 251; 29/572; 427/74; 52/173 R; 180/2.2, 65.3; 114/201 R

[56] References Cited

U.S. PATENT DOCUMENTS

| | | | |
|---|---|---|---|
| 4,141,425 | 2/1979 | Treat | 180/65 DD |
| 4,153,476 | 5/1979 | Shelpuk | 136/246 |
| 4,166,919 | 9/1979 | Carlson | 136/257 |
| 4,400,577 | 8/1983 | Spear | 136/259 |
| 4,440,153 | 4/1984 | Melchior | 126/438 |
| 4,442,310 | 4/1984 | Carlson et al. | 136/256 |
| 4,450,316 | 5/1984 | Hamakawa et al. | 136/256 |
| 4,461,922 | 7/1984 | Gay et al. | 136/249 TJ |
| 4,497,974 | 2/1985 | Deckman et al. | 136/259 |
| 4,518,815 | 5/1985 | Yamazaki | 136/244 |

FOREIGN PATENT DOCUMENTS

| | | | |
|---|---|---|---|
| 55-108780 | 8/1980 | Japan | 136/259 |
| 58-50782 | 3/1983 | Japan | 136/291 |
| 58-96948 | 6/1983 | Japan | 136/248 |
| 59-74683 | 4/1984 | Japan | 136/248 |

OTHER PUBLICATIONS

M. M. Koltun et al., *Geliotekhnika*, vol. 13, No. 1, pp. 28-31 (1977).
P. Petrov et al., *Appl. Phys. Lett.*, vol. 35, pp. 930-931 (1979).
S. Major et al., *Thin Solid Films*, vol. 125, pp. 179-185 (Mar. 1985).
D. Krish Murti, *Xerox Disclosure Journal*, vol. 7, No. 5, Sep./Oct. 1982, p. 299.
Cuevas et al., "50 Percent More Output Power from an Albedo-Collecting Flat Panel Using Bifacial Solar Cells", *Solar Energy*, vol. 29, No. 5, pp. 419-420 (1982).
Konagai et al., *Conf. Record, 16th IEEE Photovoltaic Specialists Conf.*, (1982), pp. 1321-1326.
Fan et al., *Applied Optics*, vol. 15, No. 4, pp. 1012-1017 (1976).
Lewis et al., application Ser. No. 740,945, filed 6/4/85.
J. A. Aranovich et al., *J. Appl. Phys.*, vol. 51, pp. 4260-4268 (1980).
D. E. Brodie et al., *Conference Record, 14th IEEE Photovoltaic Specialists Conf.* (1980), pp. 468-471.

*Primary Examiner*—Aaron Weisstuch
*Attorney, Agent, or Firm*—Nilsson, Robbins, Dalgarn, Berliner, Carson & Wurst

[57] ABSTRACT

A thin film photovoltaic module has transparent electrodes on front and back surfaces of a semiconductive layer. In one embodiment, both transparent electrodes pass light to the semiconductive layer for photovoltaic purposes. In another embodiment, the back electrode passes light which enters through the front electrode and is not absorbed by the semiconductive layer, so that the module is selectively transparent to the unabsorbed light. The spectral makeup of the transmitted light is controlled by controlling the optical characteristics of the layers of the module. The index of refraction of the back electrode is a primary source of transmission control, along with the refractive index of the front electrode and the thickness of the semiconductive layer itself. Light transmitted by the module can be used for nonphotovoltaic purposes, such as illuminating the interior of a vehicle or dwelling, or may be directed back into the semiconductive layer by a reflective surface behind the back electrode.

40 Claims, 15 Drawing Figures

FIG. 1
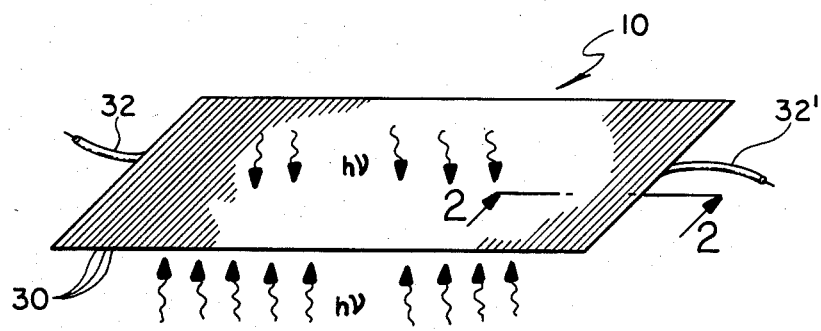
FIG. 2
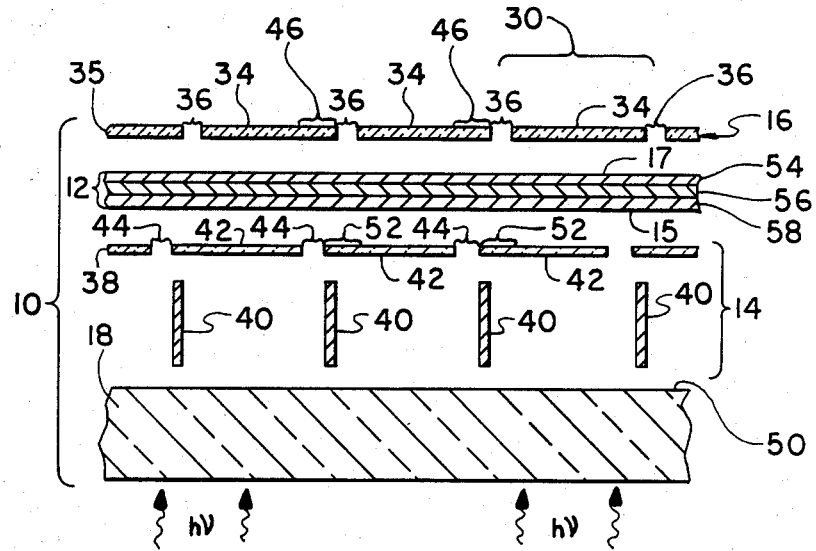
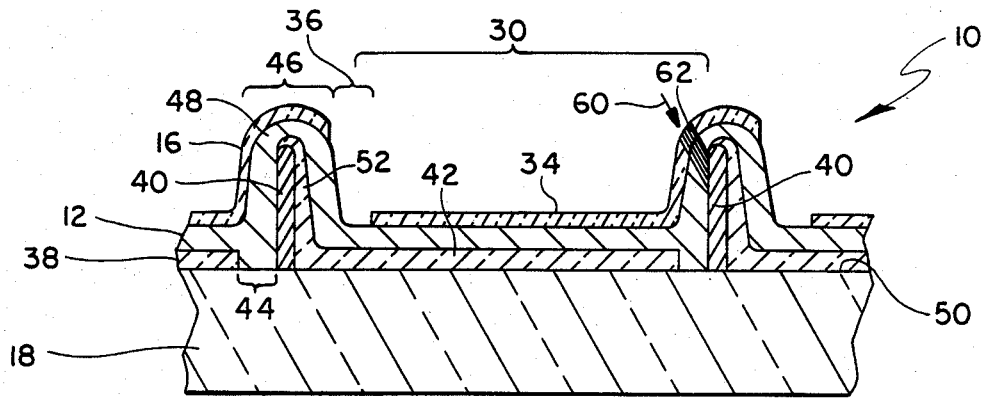
FIG. 3

TRANSPARENT PHOTOVOLTAIC MODULE

BACKGROUND OF THE INVENTION

The present invention relates generally to the photovoltaic art and, more particularly, to a thin film photovoltaic module having transparent front and back electrode arrangements.

Photovoltaic cells of the prior art have typically been opaque, extending from a first, light-incident surface having a transparent conductive electrode to a second, back surface covered by a metallic electrode film. Metallic back electrodes have been favored because they are both conductive and reflective, enhancing collection efficiency of the device and reflecting unused light back through the semiconductive layer for use in generating electricity.

A significant problem associated with photovoltaic panels is the space required to locate them in full view of the sun. If an opaque module casts a shadow on another module for part or all of a day, the shaded area of the second module is effectively removed from the current generating system.

One approach to solving the problem of module size and bulk is to form stacked modules in which one array of cells is positioned over another array of cells so that light passing unabsorbed through the upper array is absorbed by the lower array. U.S. Pat. No. 4,461,922 discloses a stacked arrangement in which an upper thin film panel has a pair of transparent electrodes for passing unused light to a lower panel for photovoltaic purposes. However, such modules are more expensive to manufacture than single panels and are opaque to incident light.

A "bifacial" array able to receive solar energy at opposite surfaces thereof is disclosed in Cuevas, et al., "50 Percent More Output Power From An Albedo-Collecting Flat Panel Using Bifacial Solar Cells", *Solar Energy*, 29-5, pages 419–420 (1982). The array disclosed therein comprises a plurality of p-type crystalline substrates with diffused regions on opposite major surfaces thereof. Each substrate forms a pair of independent solar cells able to receive light from opposite directions. The cells are made according to costly crystalline silicon technology, including the use of grid-type contacts, and absorb all radiation that reaches the semiconductive material from either direction.

Thin film cells having two transparent contacts are described in Konagai, et al., "The Effect of Residual Impurity B or P on Photovoltaic Properties of Amorphous Silicon Solar Cells", *16th IEEE Photovoltaic Specialists Conference*, San Diego, Sept. 27–30, 1982, pp. 1321–1326, but only as an experimental expedient for examining the generation of carriers by independent illumination of the cell either through its p-layer or its n-layer. The article does not propose a practical use for a transparent cell and the two sides of the cells are not illuminated simultaneously.

Therefore, it is desirable in many applications to provide an inexpensive solar module which alleviates problems associated with cell positioning and makes better use of light over the solar spectrum.

SUMMARY OF THE INVENTION

A photovoltaic module according to the present invention includes: a thin film semiconductive layer containing at least one photovoltaic region and having first and second oppositely directed major surfaces, a first transparent electrode for establishing electrical connection to the first surface of the semiconductive layer and for transmitting incident light to the semiconductive layer over a first portion of the solar spectrum, and a second transparent electrode means for establishing electrical connection to the second surface of the semiconductive layer and transmitting incident light to the semiconductive layer over a second portion of the solar spectrum.

In a preferred embodiment, the second electrode is fabricated to optically couple the semiconductive layer to the atmosphere so that the module transmits at least a portion of the light which passes through the semiconductive layer from the first electrode. The electrodes can be fabricated to maximize transmission of light by the module or to selectively attenuate transmission of the infrared component of the light. The latter objective may be accomplished by careful control of the optical properties of all layers of the module, such as their indices of refraction, transparencies, extinction coefficients, physical thicknesses, texture, and band gaps. At the same time, the first electrode, the semiconductive layer, and the second electrode are fabricated to maximize transmission of visible light.

Because the modules of the present invention are transparent to light over part of the solar spectrum, they can be used in place of conventional glass so that the transmitted light serves a separate, nonphotovoltaic purpose. Examples of such uses include windows, skylights, and vehicle sunroofs, in which it is desired to transmit visible light without the heat associated with infrared light. The spectral response of the semiconductive layer and the refractive characteristics of its transparent electrodes can be adjusted to "tune" the module to the needs of the application. Accordingly, the module performs the photovoltaic function of current generation as well as the filtering function of a window having a refractive coating. Because the module is used in place of conventional glass, placement and storage is not a problem and the cost of the module is at least partially offset by the alternative cost of glass with a comparable coating.

In another embodiment, a reflective surface can be provided behind the back surface of the module to separately illuminate the back surface of the module or reflect transmitted light back through the semiconductive layer for absorption. The reflective surface can be laminated directly to the back surface or spaced therefrom. In either case, the reflective surface can be textured so that light is scattered at acute angles through the module, increasing the chance of absorption due to increased path length.

BRIEF DESCRIPTION OF THE DRAWINGS

The above and other features of the present invention may be more fully understood from the following description, together with the accompanying drawings, wherein similar reference characters refer to similar elements throughout and in which:

FIG. 1 is a generalized perspective view of a transparent photovoltaic panel constructed in accordance with a preferred embodiment of the present invention;

FIG. 2 is a fragmentary exploded vertical sectional view taken along the line 2—2 of FIG. 1;

FIG. 3 is a fragmentary vertical sectional view of the structure of FIG. 2 in assembled form;

DESCRIPTION OF THE PREFERRED EMBODIMENTS

Figure 4:
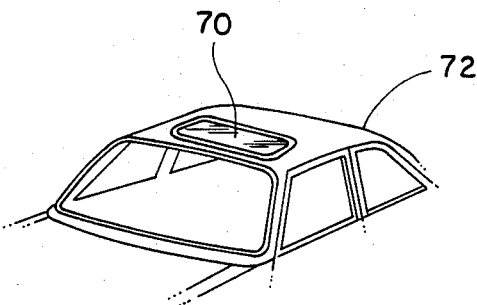
FIG. 4 is a fragmentary perspective view of the module of FIG. 1 in use as a sunroof of an automobile.

The transparent photovoltaic module of the present invention, depicted generally in FIGS. 1-3 by the numeral 10, has a semiconductive layer 12 with a first (front) transparent electrode arrangement 14 at a front surface 15 and a second (back) transparent electrode arrangement 16 at a back surface 17. The module is deposited in thin film form on a substrate 18, which may be a suitable transparent glass or plastic material, so that the module is able to receive incident light (hv) from both above and below the module. The photovoltaic layer 12 absorbs a portion of the spectrum of light transmitted to it by either of the electrode arrangements and transmits the remainder through the module, subject to any filtering properties of the opposite electrode arrangement.

Figure 12:
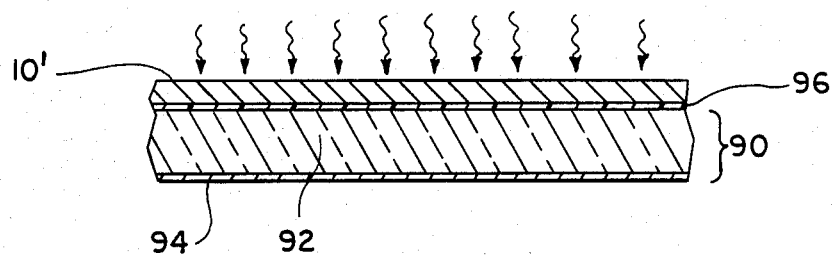
FIG. 12 is a fragmentary vertical sectional view of an alternative embodiment of the module of the present invention, in which a mirror is laminated to the back surface of the module to reflect transmitted light back through the semiconductive layer.
Figure 13:
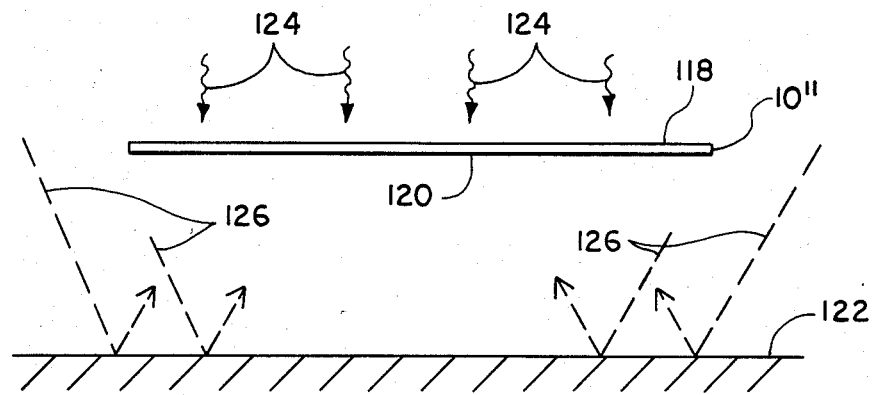
FIG. 13 is a schematic side elevational view of a transparent solar module of the present invention in position above a separate reflective surface.
Figure 14:
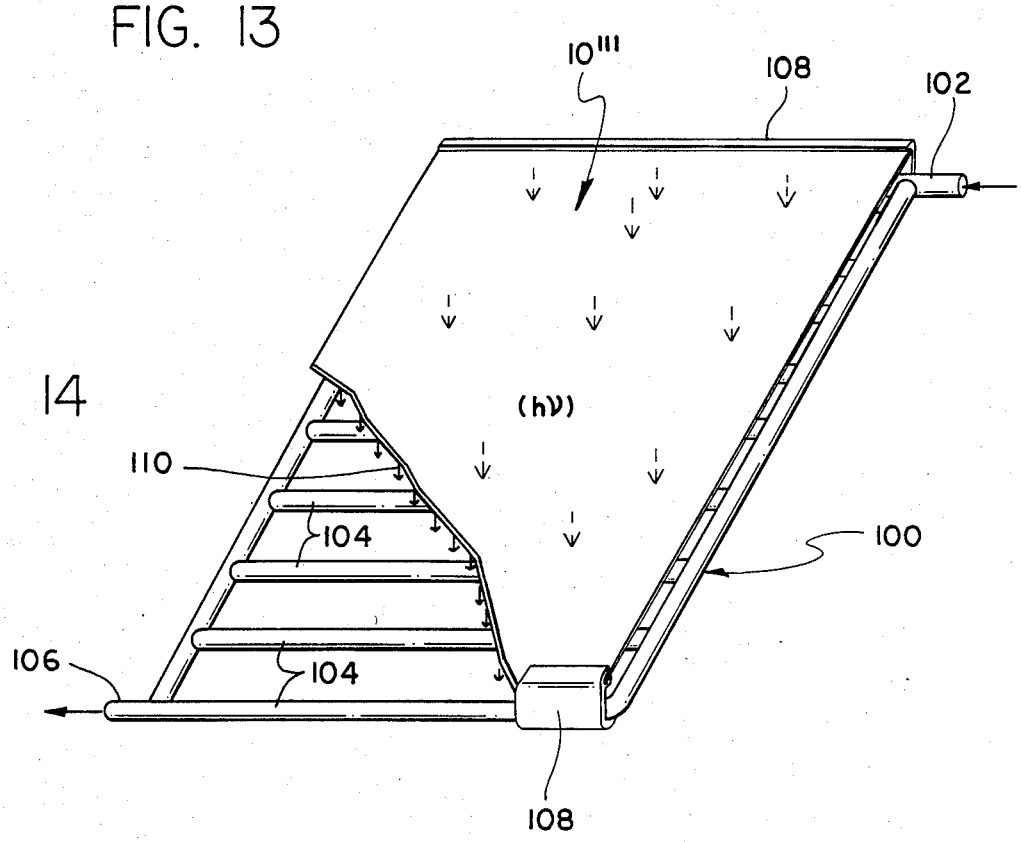
FIG. 14 is a schematic representation, partially broken away, of a further embodiment of the present invention in which a transparent solar module is placed above and spaced from a thermal absorber for more complete utilization of light in the solar spectrum.

The module 10 has a variety of applications, including use in place of panes of window glass having a refractive coating. Examples are illustrated in FIGS. 4-7, wherein the module takes the form of an automotive sunroof, a boat hatch, a window of an office building, and a skylight, respectively. Such uses typically require that the infrared component of the incident light be filtered out by the pane while allowing most of the visible component to pass. Alternatively, a mirror can be laminated to the back electrode (FIG. 12) or spaced from the back electrode (FIG. 13) for reflecting transmitted light back into the semiconductive layer, or the module can be positioned above a solar absorbing panel for use of transmitted light to heat a fluid within the panel (FIG. 14). In the embodiments of FIGS. 12-14, the module is typically designed to transmit as much of the light not used by the semiconductive layer as possible. A further application in which transmitted light is maximized is use of the module as part of the transparent exterior of a greenhouse (not shown).

A key attribute of the module 10 is its ability to be "tuned" to selectively transmit or filter light in different portions of the solar spectrum, depending upon application. The two electrode arrangements and the semiconductive layer can be tuned to filter out virtually all of the undesired infrared component in the applications of FIGS. 4-7, or to pass as much light as possible in the application of FIGS. 12-14.

Figure 8:
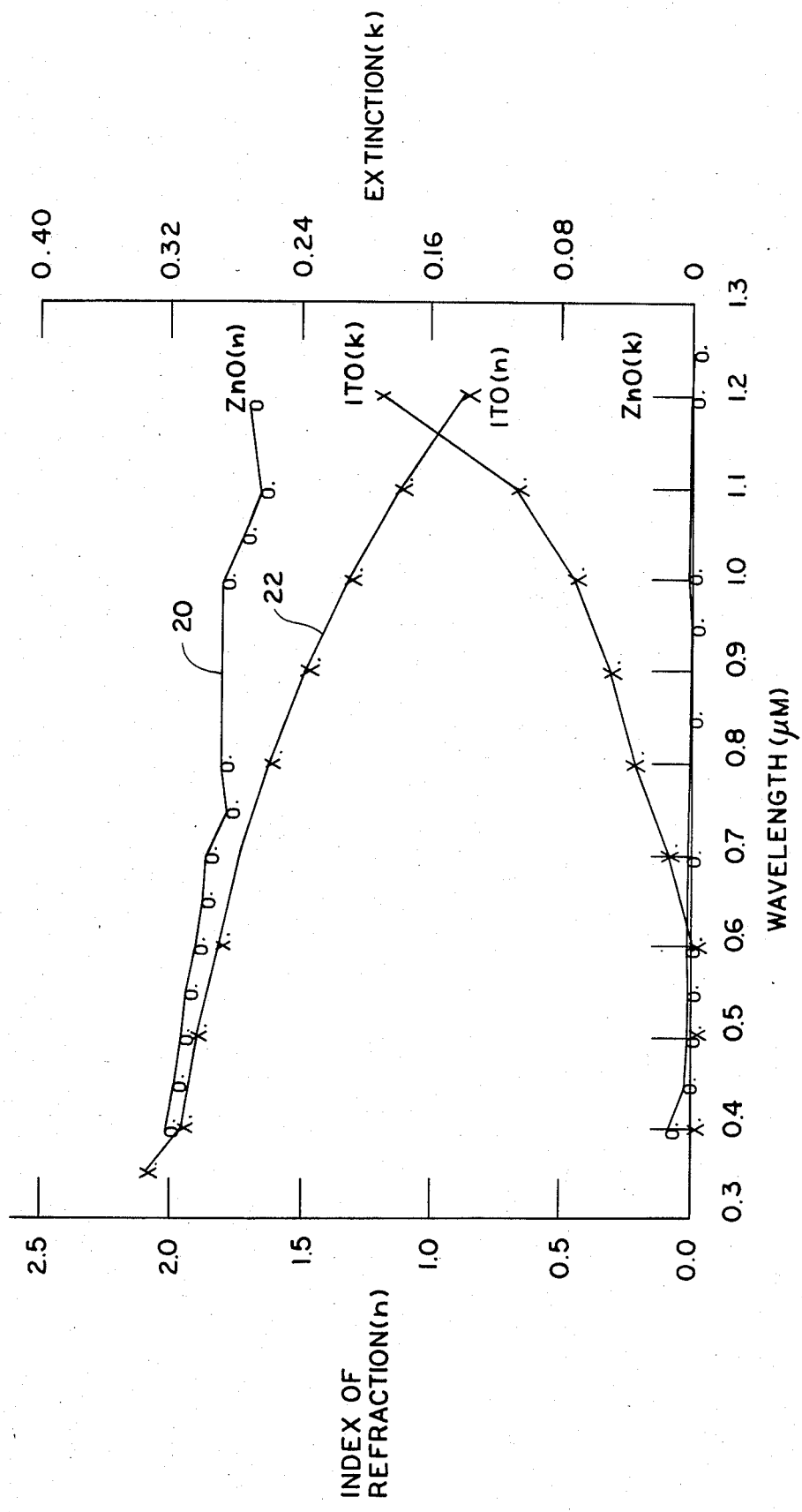
FIG. 8 is a graphical representation of the refractive indices (n) and extinction coefficients (k) of zinc oxide and indium tin oxide as functions of the wavelength of light.

A parameter having a significant effect upon transmission of infrared light is the index of refraction of the layers of the module, and particularly the index of the back electrode arrangement from which light must pass to the surrounding air if it is to be transmitted by the module. However, the refractive index of a transparent conductor often varies widely over the solar spectrum. This phenomenon is illustrated graphically in FIG. 8, wherein the upper line 20 represents the refractive index of substantially pure zinc oxide (no additives added) over the solar spectrum and the lower line 22 represents the refractive index of substantially pure indium tin oxide. Whereas the index of zinc oxide is approximately 1.7 or higher over the entire solar spectrum, the index of indium tin oxide drops off drastically in the infrared range (wavelengths of 0.7 microns and above). It is difficult for infrared radiation to escape outwardly from the back electrode arrangement at an index of refraction below approximately 1.7 microns, reducing the infrared transmission of the module. Thus, a module having a thin film of substantially pure indium tin oxide or a similar transparent material as one of its electrodes effectively filters out much of the infrared component of incident light. This is particularly true when the low index material is used in the back electrode, from which light passes outwardly to the surrounding atmosphere.

The thin film photovoltaic module of the present invention may be constructed of monolithic material containing solar cells interconnected in various ways and deposited by various processing techniques, of which the module 10 is a preferred embodiment. It will, of course, be understood that the following description is given by way of example only and not limitation.

Referring now specifically to FIG. 1, the module 10 constructed according to a preferred embodiment of the present invention defines a plurality of elongated solar cells 30 connected electrically in series between a pair of external leads 32—32'. The cells are shaped as narrow strips connected along opposite longitudinal edges to minimize series resistance losses. Connection between cells is accomplished through an unpatterned active film of the solar panel, without interrupting the film. Current generated by the cells in response to incident light (hv) travels a very short distance within each cell electrode before passing to the opposite electrode of an adjacent cell.

With reference now to FIG. 2, the electrode arrangement 16 comprises a plurality of back electrode portions 34 formed of a transparent conductive layer 35 separated by a nonconducting spacing 36 and arranged to substantially overlie elongated photovoltaic regions of the thin film. The front electrode arrangement 14 includes a transparent conductive layer 38 and a series of thickened contact portions or "stitch bars" 40. The layer 38 is patterned to form a plurality of transparent electrode portions 42 separated by spacings 44 and substantially underlying the respective photovoltaic regions. The photovoltaic regions are thus effectively sandwiched between the back electrode portions 34 and the front electrode portions 42 for collection of current generated within the regions. In addition, each front electrode portion partially overlaps the back electrode portion of an adjacent photovoltaic region over a preselected area 46.

A major feature of this construction is the provision of conductive paths 62 substantially transversely through the active thin film 12 between each front electrode portion and the back electrode portion of an adjacent photovoltaic region. Interconnection is accomplished at the area of electrode overlap to connect the photovoltaic regions electrically in series without patterning or otherwise interrupting the film.

In the embodiment as illustrated, the stitch bars 40 are tall enough and narrow enough, in comparison to the thin film 12, to electrically short through the film. The final configuration of the solar module 10 is illustrated best in FIG. 3, wherein the stitch bars cause the subsequently applied film 12 to be distorted in a manner producing relatively thin regions 48 which are unable to withstand the cell voltage. It is advantageous that the stitch bars be as rough as possible at their upper surfaces to focus the applied electric field and further reduce the resistance of the regions 48.

The stitch bars 40 are preferably approximately 25 microns thick, and the semiconductive thin film 12 and the patterned transparent conductive layers 35 and 38 are each approximately 5,000 angstroms thick. At the locations of the stitch bars 40, the film 12 is sandwiched between a pair of conductive elements and the stitch bars 40 are at least two times thicker than the thickest portion of the film 12. This produces an effective short circuit through the film in the area of each stitch bar, but does not short out the cells 30 because the film 12 has a very high sheet resistance. The sheet resistance virtually eliminates current within the plane of the film, leaving only substantially transverse currents developed within the photovoltaic regions and passed between the electrodes at the areas of overlap.

Referring to FIGS. 2 and 3 in more detail, the various layers and electrode portions of the panel 10 are sequentially deposited on a major surface 50 of the substrate 18. The substrate is preferably glass or other suitable transparent material which is compatible with the materials of the stitch bars 40 and the transparent conductive layer 38. The stitch bars may be applied to the substrate either before or after the transparent conductive layer, by screen printing, electroplating, evaporation through a mask, or other techniques well known to the art. The material of the stitch bars may be silver, aluminum, nickel, or other material providing a high quality contact.

Although the stitch bars 40 are illustrated as grid lines or sections of grid lines passing through the preselected areas 46 of electrode overlap, it is not necessary that they be continuous or that they be lines at all. If the stitch bars are screen printed, they should be at least approximately 25 microns in height to operate satisfactorily. If evaporated, they should be at least 2 microns, and preferably 10 microns, in height. In each case, the aspect ratio (height divided by width) and the roughness of the stitch bars are the parameters responsible for the localized short circuit 62 that permits the panel 10 to operate.

The transparent conductive (TC) layer 38 is preferably deposited, in the first instance, as a continuous layer. ITO for example, may be deposited at approximately 300 degrees Celsius by vacuum evaporation of indium and tin in an oxygen atmosphere with glow discharge assistance. The glow discharge activates the oxygen to produce a high quality film. After deposition, the transparent conductive layer 38 is patterned using conventional techniques, such as laser scribing. In the case of the panel 10, the patterning operation entails removal of the transparent conductive layer along a series of parallel lines near the stitch bars 40, yielding the front electrode portions 42 separated by spacing 44. The front electrode portions are thus shaped as parallel strips corresponding generally in area to the cells 30 of FIG. 1. However, the front electrode portions 42 and the cells 30 need not be shaped as strips, as long as each front electrode portion is provided with an interconnecting portion 52 which overlaps part of the back electrode portion of an adjacent photovoltaic region. Although the layer 38 can be applied either before or after the stitch bars 40, it is preferably not patterned until after the stitch bars have been applied. The stitch bars 40 then act as a guide for patterning the layer 38.

The thickness of the transparent conductive layer 38 is selected to minimize reflection from the back surface of the layer and absorption of light by it. According to established optical principles, internal reflection losses within a transparent body are minimized when the thickness of the body is an odd multiple of one-fourth of the wavelength of incident light for the case in which light travels from a material of low refractive index to a material of high refractive index. For present purposes, the relevant wavelength is that at the peak of the spectral response of the photovoltaic material making up the film 12. The TC layer will also be chosen to be thermally compatible with the layer 12.

As above noted, the thin film 12 may contain any suitable photovoltaic material defining a photojunction for conversion of light to electrical energy. In the preferred embodiment, the film 12 is thin film silicon-hydrogen alloy (TFS) having n+, i and p+ layers 54, 56 and 58, respectively, as illustrated in FIG. 2. In the case of TFS, the film 12 is deposited by conventional glow discharge techniques without patterning or masking. The film 12 extends continuously and completely across the stitch bars 40, the transparent conductive layer 38 and the spacings 44. The thickness of the TFS film 12, complete with all three layers of different conductivity types, is typically between approximately 1,000 and 10,000 angstroms. The thickness of the TFS in a particular application is dependent on the particular material used and on the desired level of light transmittance in the visible range.

The back electrode arrangement 16 serves as the back contact of the cells 30 and is preferably a TC layer formed by following the same parameters as above-described. However, the material of the back electrode arrangement can be different, as required to meet the filtering requirements of a particular application.

Although shorting through the film 12 can be achieved in many circumstances with the structure described above, it is sometimes desirable to enhance localized conduction through the thin film 12 by applying heat to the solar panel 10. It is usually desirable to apply heat only at localized areas within the preselected areas of overlap 46 by directing a laser beam 60 or other suitable source of localized heat onto the module. In the case in which the stitch bars 40 are relatively high, narrow and rough, such heating can cause dispersal of the back electrode material, and possibly the material of the stitch bars 40, through the thickness of the semiconductive film 12. The resulting composite region 62 is much more conductive than the bulk of the film and enhances interconnection of the cells.

In constructing the monolithic module 10 by deposition on the substrate 18, a layer of transparent conductive material (TC) is deposited on the substrate 18 and subsequently on the semiconductive layer 12 after it is deposited on the first layer 38. The TC layer, which is found on both sides of the monolithic layer 12, may be formed of any transparent conductive material known to the art and having optical, electrical and mechanical properties compatible with the semiconductor material being utilized. For example, indium-tin-oxide (ITO), tin oxide (TO), indium oxide (IO), zinc oxide (ZnO), or other similar materials well known in the art may be utilized.

By choosing and tailoring the properties of the TC layers, the voltages and optics of the system may be tailored in accordance with the particular semiconductor materials and the particular application for which the module 10 is intended. Compensational adjustments and inclusion of additives are useful in this regard. Another factor in choosing a particular TC layer is that its coefficient of thermal expansion be compatible with that of the monolithic thin film. This keeps the film from being stressed during heating through absorption of the solar light. Perhaps most importantly, by choosing the appropriate index of refraction, extinction coefficient, thickness, conductivity, and band gap of the TC layer, one may control the effective filter characteristics of the TC layer; that is, to reflect all or part of the solar spectrum or to permit it to pass through the TC layer.

Figure 5:
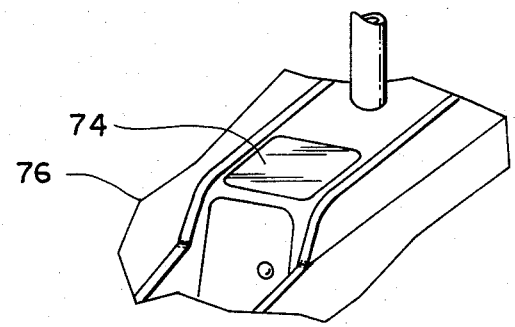
FIG. 5 is a fragmentary perspective view of the module of FIG. 1 in use as a transparent hatch cover of a boat.
Figure 6:
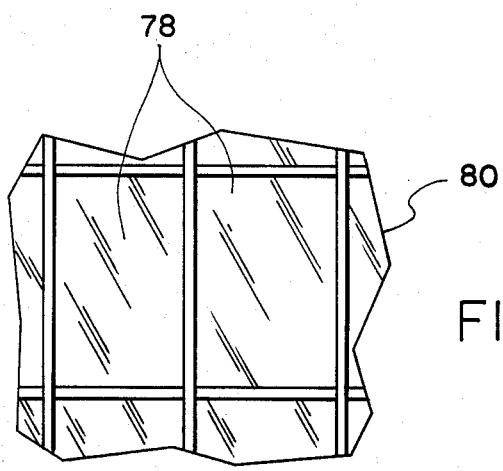
FIG. 6 is a fragmentary side elevational view of the module of FIG. 1 in use as a window of a building.
Figure 7:
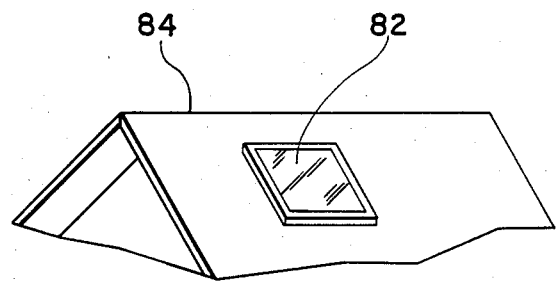
FIG. 7 is a fragmentary perspective view of the module of FIG. 1 in use as a skylight.

The tailoring or "tuning" of the various layers of the module 10 to a particular application can be best understood by way of example. Referencing FIGS. 4–7, the embodiments shown are similar in that each transmits visible light to the interior of an associated structure while filtering out infrared light. The module 70 of FIG. 4 is configured as a partially transparent sunroof of an automobile 72 which admits visible light to the interior of the automobile but filters out the infrared. This gives the occupant an open feeling without subjecting him or her to the heat of ordinary sunlight. At the same time, electrical power is generated to operate accessories or trickle charge a battery required to maintain the memory of an on-board computer. If it is desired to introduce light from the entire solar spectrum, the sunroof can be removed or slid rearwardly, as known in the art, depending upon its design. FIG. 5 illustrates a similar module 74 configured as a partially transparent hatch of a sailboat 76, and FIGS. 6 and 7 illustrate window modules 78 of a building 80 and a skylight module 82 of a dwelling 84, respectively. In each case, the modules 70, 74, 78, and 82 generate electricity according to photovoltaic principles while transmitting useful visible light and filtering infrared light to help insulate a structure.

In the embodiments of FIGS. 4–7, the goal of passing substantial visible light requires that the semiconductive layer 12 be thin and that the electrode arrangements 14 and 16 be transparent to visible light. At the same time, the infrared portion of the spectrum must be selectively decoupled from the incident light. That is most easily accomplished by forming the back electrode of a material having a refractive index below approximately 1.7 and an extinction coefficient of at least 0.05 over much of the infrared range. Materials suitable for this purpose will typically have extinction coefficients varying from approximately zero to a maximum as high as 0.4 in the infrared range. When the back electrode has the specified index of refraction and extinction coefficient, a significant proportion of the infrared light passed by the semiconductive layer is blocked. Much of it is internally reflected by the outer surface of the electrode and transmitted back through the semiconductive layer.

Substantially pure ITO has the characteristics described above, as indicated in the graph of FIG. 8. Thus, the refractive index (n) of ITO at wavelengths over 0.7 microns decreases steadily from approximately 1.7 to less than 1.0, while the extinction coefficient (k) increases from approximately 0.02 to more than 0.2 within the same range. In fact, the extinction coefficient of ITO exceeds 0.05 at all wavelengths over approximately 0.9 microns. Thus, ITO is a prime candidate for selectively attenuating transmission of infrared light by the module of the present invention.

The behavior of a thin film silicon-based solar module similar to the module 10 described above has been modeled on a computer. The model had a layer of ZnO as a front electrode (light-incident side) and a layer of ITO as a rear electrode (transmitting side), and was clad with glass on both sides. Both the front and rear electrodes of the model were 3560 angstroms thick, which thickness was chosen based on the known optical constants of the materials and the electrical requirements of using them as current collection electrodes. The semiconductive layer 12 was assumed to be a homogeneous layer 3000 angstroms thick of thin film silicon-hydrogen alloy having a band gap of 1.72 ($E_o$). For purposes of the model, the n and p-layers of the semiconductive material were assumed to have the same optical properties as the i-layer. This is justified because the n and p-layers are thin and their optical contributions are small, accounting for no more than small perturbations in the transmission of light. As in the case of any transparent module designed according to the teachings of the present invention, the thicknesses of all layers of the model were determined by weighing the tradeoffs between desired electrical and optical performance of the module. Thus, modules designed with different criteria in mind would typically have layer dimensions different from those of the model, but the dimensions would be arrived at by a similar performance analysis.

Figure 9:
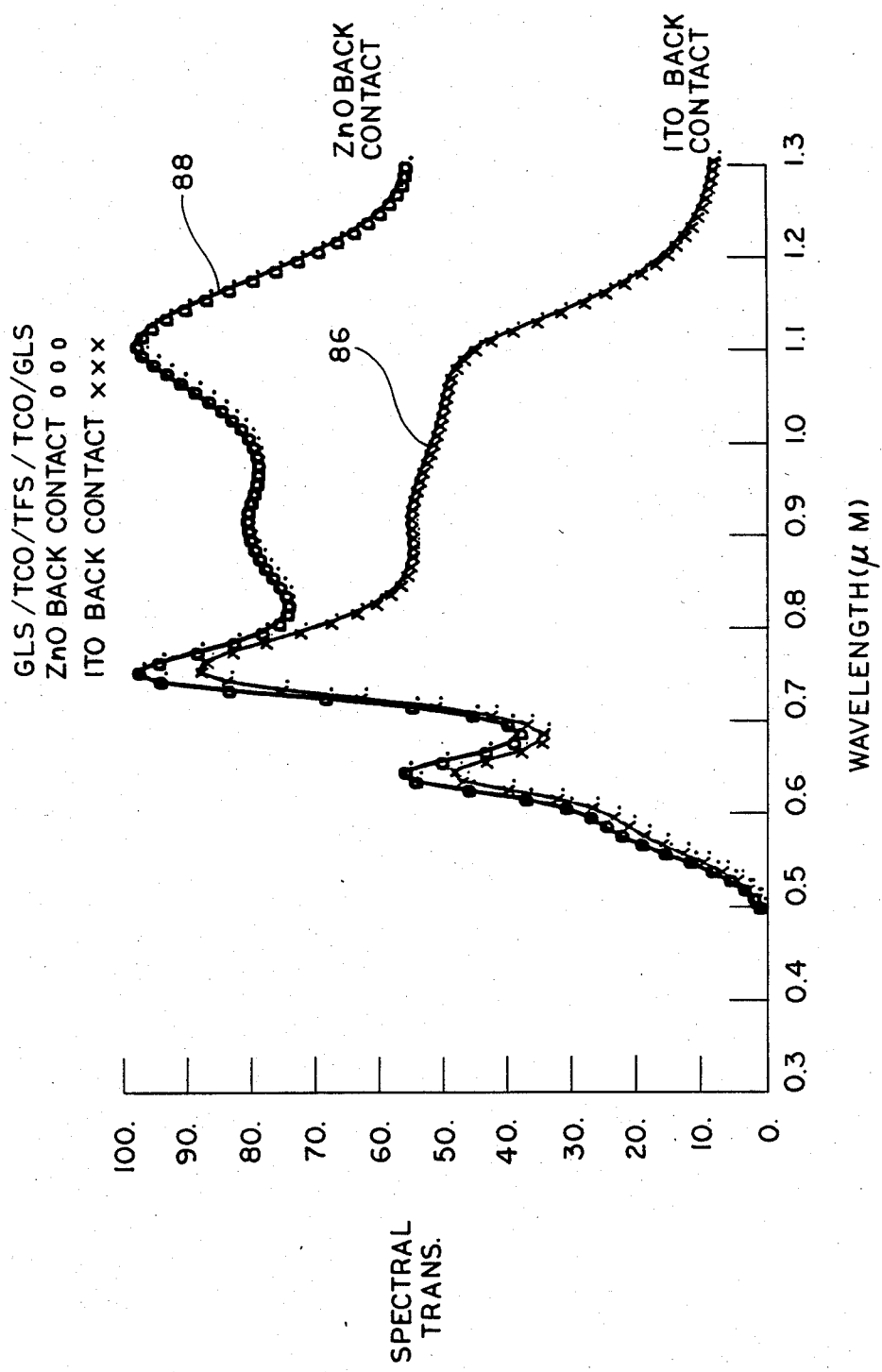
FIG. 9 is a graphical representation of relative light transmittance data generated by computer modeling of a thin film solar cell having zinc oxide electrodes and a comparable cell having indium tin oxide electrodes, over the solar spectrum.

The transmittance characteristics predicted by the model are represented by the lower curve 86 of FIG. 9, in which transmittance by the module in the infrared region (wavelengths of 0.7 microns and above) is attenuated. Transmittance in the wavelength range 0.8 to 1.1 microns is approximately 50 percent, while that above 1.1 microns falls rapidly to approximately 10 percent.

By contrast, the results of a similar model of a module having a pair of electrodes of substantially pure ZnO is illustrated by the curve 88 which shows a significantly higher transmittance of infrared light (80 to 100 percent between 0.8 and 1.2 microns). If desired, the infrared transmittance of the module having ITO electrodes can be reduced even further by modification of the electrode material. Techniques which produce an increase in the conductivity of ITO tend to create a corresponding decrease in its index of refraction. However, this attenuates the visible transmittance as well as the infrared transmittance of the material and must be carefully controlled.

TO is also useful as a front or back electrode material in the embodiments of FIGS. 4–7 because it has an index of refraction of approximately 1.9. Much like ITO, the index of refraction of TO can be decreased by adding fluorine or antimony to tune the cell to filter out an undesired portion of the solar spectrum.

Suitable thin film composites of high reflectance metals and metal oxides, laid up in symmetrical stacks, can also serve as one or both of the transparent electrodes of the module 10. Such materials are conductive, somewhat transparent, and selectively reflect infrared light. A preferred form of such a composite is a zinc oxide (ZnO)/silver (Ag) stack having a total thickness of approximately 500–2000 angstroms with ZnO films on both outer surfaces of the stack. For example, the stack may comprise a pair of ZnO layers approximately 400–1000 angstroms thick on either side of a 50–200 angstrom layer of Ag. The zinc oxide in contact with the semiconductor must be electrically conductive to permit low resistance contacts. Electrical conductivity of ZnO for this purpose can be enhanced by addition of group III elements or hydrogen.

The preparation and use of such composites are described in greater detail in Fan, et al., "Transparent Heat Mirrors For Solar Energy Applications", *Applied Optics*, 15-4, pages 1012–1017 (1976), the disclosure of which is hereby incorporated by reference. The Fan, et al., article describes the use of such composites as selective light absorbers but does not propose use as a transparent conductive electrode of a solar cell.

The light transmittance of a composite stack of the type described above can be controlled over the solar spectrum by choice of appropriate materials and thicknesses for the metal and metal oxide layers. For example, the metal oxide may be a suitable transparent conductive oxide, such as ITO or TO, or may be a relatively transparent high refractive index material, such as $TiO_2$. Likewise, other suitable metals, including aluminum, can be used as the thin metallic layer of the stack.

In some cases, a suitable electrode can be prepared by depositing the first metallic layer of the above-described stack in contact with the semiconductive layer, omitting the first metal oxide layer and the steps required to deposit it. The remaining layers are then unchanged. A two-layer stack embodying this concept is illustrated at 132 in FIG. 10, wherein the layer directly adjacent to the semiconductive layer 12 is a thin metallic layer 134. The metal may be aluminum, although silver is preferred for its superior optical properties in the short wavelength region. The thickness of the metal layer typically ranges between 50 and 200 angstroms. The next layer is a metal oxide layer 136 which is similar in make-up to the oxide layers of the composite stack discused above and has optical properties chosen to tune the light transmittance of the cell. Thus, the layer 136 may be ITO having an index of refraction less than 1.7 and an extinction coefficient greater than 0.05 over most of the infrared spectrum when it is desired to filter out a large proportion of the infrared light. In that case, the thickness of the layer would typically be between 400 and 1000 angstroms. Alternatively, a material of higher index and/or lower extinction coefficient can be used to pass a greater proportion of the infrared. An example of such a material is ZnO, having a refractive index greater than 1.7 and an extinction coefficient of virtually zero over the infrared spectrum. In such two-layer stacks, the semiconductive layer acts as an integral part of the optical electrode element and as the material that generates photocurrent.

Figure 10:
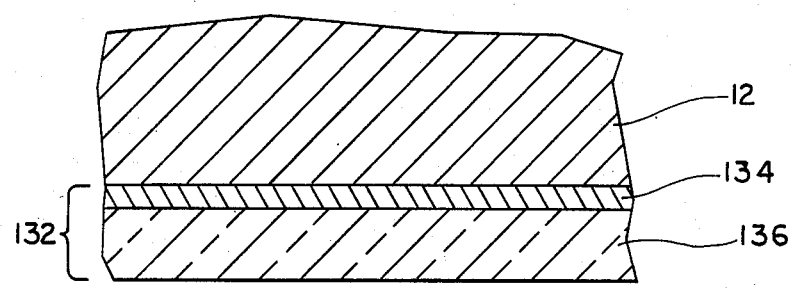
FIG. 10 is a fragmentary vertical sectional view of a portion of a composite transparent electrode film prepared according to a preferred embodiment of the present invention and in contact with a portion of the semiconductive layer of the module.

The two layer assembly 132 of FIG. 10 may be repeated a number of times to increase conductivity. With appropriate choices of layer materials and thicknesses, light transmission need not be significantly reduced. For maximum transmittance it is preferred that each oxide layer be an integral number of half wavelengths thick.

Figure 11:
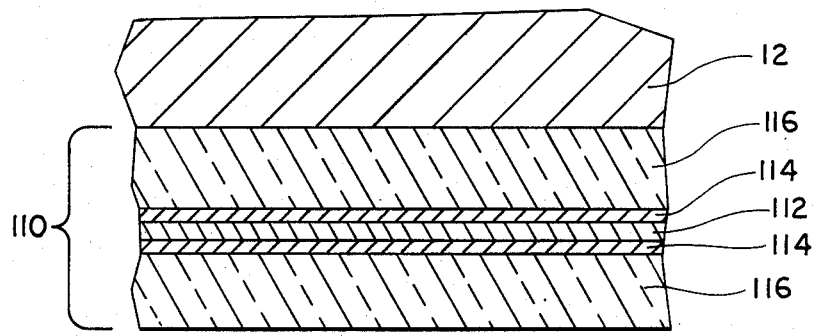
FIG. 11 is a fragmentary vertical sectional view of a portion of another composite transparent electrode film prepared according to a preferred embodiment of the invention and in contact with a portion of the semiconductor layer of the module.

Another preferred embodiment of a thin film composite suitable for use as a transparent electrode of the module 10 is shown at 110 in FIG. 11. The stack 110 is in electrical contact with a surface of the semiconductive layer 12 for transmission of light therebetween, between, and is preferably symmetrical about a thin central layer 112 of Ag or other suitable metal approximately 50 to 200 angstroms thick. When the semiconductive layer 12 is a thin film silicon-containing layer, the silver layer is chemically isolated from it by a pair of $TiO_2$ layers 114 which may be approximately 50 angstroms thick and act as a barrier to diffusion and oxidation of the silver. The combination of the silver and $TiO_2$ layers is sandwiched between a pair of relatively thick transparent conductive (TC) layers 116. The TC layers 116 may be made of ZnO, ITO, TO, or other material of suitable conductivity, transmissivity, index of refraction and extinction coefficient, and which is compatible with the silicon-containing material of the semiconductive layer 12. The preferred thickness of the TC layers 116 is approximately 900 angstroms in the case of ZnO or ITO, but may vary between approximately 500 and 2000 angstroms. When ZnO is used, it is preferably formulated as disclosed in the copending U.S. patent application Ser. No. 740,945 of Lewis, et al., for "Photoconductive Device Containing Zinc Oxide Transparent Conductive Layer", which was filed concurrently herewith. The disclosure of that application is hereby incorporated by reference for all purposes. The conductivity, thickness and index of refraction of the material will, of course, be chosen to optimize cell output and to selectively transmit light within a preselected wavelength range. However, the composite structures described above will always reflect infrared light to some degree.

In any of the above-described composite structures, the layer adjacent to the semiconductive layer 12 must make good electrical contact to the semiconductive layer if the cell is to operate. When the nearest layer is ZnO or ITO, its conductivity must be relatively high to make a good contact with thin film silicon-based materials. In the case of ZnO, this is done by including boron, aluminum, or other suitable additive, as discussed in the above-identified copending application.

Other parameters important to satisfactory operation of the embodiments of FIGS. 4–7 are the thickness and make-up of the semiconductive layer 12. In the case of thin film silicon (TFS) having an average band gap of at least approximately 1.7, the thickness can be anywhere between approximately 1000 angstroms and 10,000 angstroms, with transmittance of visible light being noticeably lower at thicknesses above 5000 angstroms. The preferred range of thickness of a thin film silicon-based semiconductive layer for these purposes is 2000 to 5000 angstroms and the optimal thickness is believed to be approximately 3500 angstroms. At that thickness, the material transmits a significant amount of visible light while maintaining a suitable electric field within the photoconductive region.

A different set of operating constraints are encountered in the embodiments of FIGS. 12, 13, and 14. FIG. 12 illustrates a solar model 10' which is constructed generally according to the teachings of the present invention for the module 10 and is laminated to a mirror 90 made up of a sheet of glass 92 having a back reflective coating 94. The mirror structure 90 and the module 10' are joined by an interface layer 96 which is optically transparent and thermally stable. Examples of materials suitable for forming the interface layer are air, inert gas, silicone, polyvinyl butyral (PVB), and ethylene vinyl acetate (EVA). The latter three materials are dielectric pottant materials by which the mirror structure 90 is laminated directly to the module 10'. In a preferred form, the module 10', the interface layer 96, and the mirror 90 are 1.1, 0.5 and 3.0 millimeters thick, respectively. The mirror may also be a suitable metalized plastic, and may be inverted with the metal facing the opposite direction for use as a plastic base layer.

FIG. 13 illustrates a bifacial solar module 10" which is generally similar to the module 10' and extends from an exposed upper surface 118 to a lower surface 120 spaced from a separate reflective surface 122. The reflective surface 122 is represented schematically as a single flat surface, but may take the form of any structure capable of reflecting light onto the lower surface of the module 10". In the simplest case, the surface 122 is a layer of white rock or other reflective material on the ground beneath the module. Alternatively, it can be a mirror or a plurality of mirrors positioned to reflect light onto one or both surfaces of the module.

The embodiment of FIG. 14 comprises a module 10''' constructed according to the teachings of the present invention and positioned over a solar thermal panel 100 which is designed to absorb infrared light. The panel 100 may take the form of any suitable solar absorber known in the art, and preferably has a fluid inlet 102, a plurality of fluid passages 104 and a fluid outlet 106. The illustrated panel 10''' is affixed to the panel 100 by end brackets 108 so that the module 10''' is spaced from and parallel to the panel 100. The module 10''' is spaced from the panel 100 because the temperatures reached by the panel 100 during operation would impair the performance of the photovoltaic module.

In operation, the modules 10', 10", and 10''' are exposed to incident radiation (hv) which is selectively transmitted by them to reach the mirror structure 90, the reflective material 122, and the panel 100, respectively. Referring specifically to FIG. 12, the mirror structure 90 reflects transmitted light back into the module 10' to increase the length of the light's path through the semiconductive layer of the module and thus increase the chance of the light being absorbed. In a preferred embodiment, the reflective film 94 is textured on a microscopic scale to scatter the reflected light over acute angles and further increase its mean path length. The ability to readily texture the reflective surface 94 of the mirror structure 90, made possible by the fact that the mirror is separate from the back electrode of the cell, is a key advantage of the embodiment of FIG. 12 over prior metal-backed solar cells. In a preferred form, the surface 94 is a sheet of textured foil or other suitable material applied to the surface of the glass 92. It is also convenient to mirror coat the textured surface of commercially available stippled glass to reduce glare and capture light rays which are incident to the glass at oblique angles.

In the embodiment of FIG. 13, the module 10" is oriented so that its upper surface 118 is exposed to incident light 124 while its lower surface 120 receives light 126 reflected by the surface 122. Thus, the module 10" is a bifacial module identical to the module 10', in which each cell is exposed to more than "one sun" of light. This permits the output of the module to be greater than conventional one-sided cells without increased material or processing costs. At the same time, the module 10" is transparent to a portion of the incident light, most of which is directed back into the semiconductive layer 12 of the module by the reflective surface 122.

The embodiment of FIG. 14 relies upon light transmitted by the module 10''' to heat the panel 100. The transmitted light is depicted by the numeral 110 and is directly related to the characteristics of the semiconductive layer and the transparent electrodes of the module 10'''.

In the embodiments of FIGS. 12, 13, and 14, it is desirable to make full use of the photovoltaic layer to generate electricity while passing as much of the remaining radiation as possible through of the module. Transmitted radiation is returned to the semiconductive layer for generation of electricity in the embodiments of FIGS. 12 and 13, and is used to generate heat within the panel 100 in the embodiment of FIG. 14. Thus, the material used for the front and back contacts of the modules 10', 10", and 10''' should have a high index of refraction and high transparency. The index of refraction and extinction coefficient depicted in FIG. 8 for zinc oxide are suitable for this purpose and lead to the enhanced spectral transmittance curve 88 of FIG. 9.

The conductivity of ZnO can be increased, and its index of refraction decreased, by inclusion of suitable additives, such as boron, aluminum, gallium, indium, or thallium. Thus, the relevant transmittance properties of the cell can be tuned by controlled addition of the listed elements to the ZnO electrode material. In addition, ZnO has a lower optical absorption edge than TO, causing it to filter out some of the blue light. The preparation and control of such ZnO compositions are disclosed in detail in the above-identified copending application of Lewis, et al.

A variety of other materials can be used for the front and/or back contacts of the modules 10', 10" and 10''', some having even higher indices of refraction than zinc oxide over the solar spectrum. One such material is cadmium sulphide (CdS), which has an index of refraction of approximately 2.1 to 2.5. However, when CdS is used in conjunction with a semiconductive layer of a thin film silicon-based material, it is necessary to dope the CdS with indium (In) or other suitable material to increase its conductivity to the point at which it makes good electrical contact to silicon.

Figure 15:
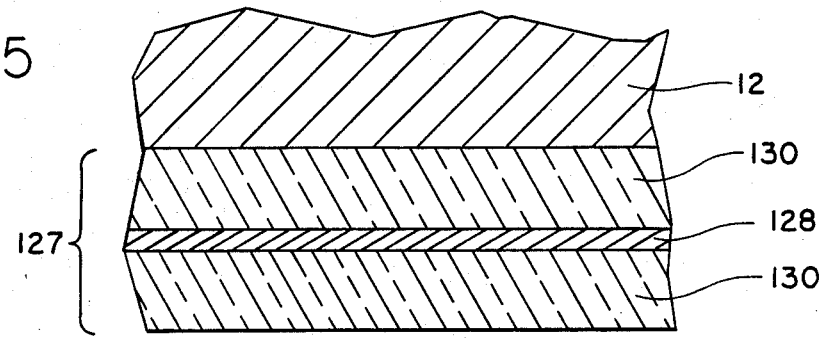
FIG. 15 is a fragmentary vertical sectional view similar to FIG. 11 of a portion of a composite transparent electrode film prepared according to another preferred embodiment of the invention.

Thin film composites are also useful as the front and/or back contacts of the modules 10', 10", and 10''', subject to similar requirements of conductivity, transparency and index of refraction. A composite found to be particularly useful in this context is illustrated in FIG. 15 at 127, wherein 128 is a relatively thin layer of a material of high refractive index sandwiched between two layers 130 of a suitable transparent conductor. In a preferred embodiment, the layer 128 is a layer of $TiO_2$ approximately 100 angstroms thick and the layers 130 are layers of ITO several hundred angstroms thick. The $TiO_2$ layer, having an index of refraction of 2.2 to 2.3, acts as the primary optical component, and the ITO layers impart electrical conductivity to the structure. The composite has an effective index of refraction greater than approximately 1.7 over the majority of the solar spectrum, despite the fact that its major component, ITO, has a much lower index in the infrared range. The index of refraction of the composite can be tailored to the needs of a specific application by varying the thicknesses and compositions of the layers. For example, the overall index of refraction can be increased dramatically by the use of ZnO in place of ITO. However, in that case $TiO_2$ might not be required because the index of pure ZnO is itself high enough for most purposes.

Because the utilization of incoming radiation to generate electricity is particularly important in the embodiments of FIGS. 11, 12, and 13, it is desirable in most cases to maintain the thickness of the semiconductive layer at approximately 5000 angstroms or more. However, thickness is only one of many factors which determine the operating characteristics of the device, and must be weighed with the other factors to arrive at a preferred arrangement. Practical devices can be obtained at thicknesses of 1000 to 10,000 angstroms, or more.

When the semiconductive layer 12 is of the p-i-n type, the p-type region is typically a "window layer" having a band gap high enough to be transparent to incoming light. Accordingly, virtually all light of the relevant wavelength range passes through the p-layer for absorption by the i-layer. In such cells, it is not necessary for the n-layer to be a window layer, as well. However, in the embodiments of FIGS. 12, 13, and 14, the transmissivity of the n-layer is significant because any absorption in the n-layer reduces transmitted light without contributing to the photovoltaic affect. To be suitably transparent for these purposes, a thin film silicon-type n-layer should have a band gap of at least approximately 1.85 electron volts. Such a band gap can be obtained by inclusion of carbon or other suitable additive within the n-layer.

From the above, it can be seen that there has been provided a stand-alone transparent solar module which can be illuminated on both sides and is tunable in its light transmitting properties over the solar spectrum to perform a wide variety of functions. The controllable transparency of the module enables it to be substituted for glass in conventional applications or used in conjunction with other energy systems to reduce the obtrusiveness and space requirements usually associated with solar modules.

While certain specific embodiments of the invention have been disclosed as typical, the invention is not limited to these particular forms, but rather is applicable broadly to all such variations as fall within the scope of the appended claims. As an example, the photovoltaic module of the present invention need not have a silicon-based semiconductive layer, but rather may incorporate any known photovoltaic material for which suitable contact materials exist. The compositions, thicknesses and preparation of the semiconductive layer and the transparent electrodes must then be adapted to that material.

What is claimed is:

1. A photovoltaic module comprising:
   a thin film semiconductive layer containing at least one photovoltaic region and having front and back oppositely directed major surfaces;
   a transparent front electrode which provides electrical connection to the front surface of the semiconductive layer and transmits incident solar radiation to the semiconductive layer over a preselected spectrum; and
   a transparent back electrode which provides electrical connection to the back surface of the semiconductive layer and optically couples the semiconductive layer to the atmosphere to permit transmission by the module of at least a portion of the incident radiation not absorbed by the semiconductive layer;
   the back electrode comprising zinc oxide.

2. The photovoltaic module of claim 1 which further comprises:
   means for causing solar radiation to impinge upon both of said electrodes.

3. The photovoltaic module of claim 2 which further comprises:
   means for mounting the module so that solar radiation impinges directly on one of said surfaces; and
   means for reflecting solar radiation onto the other of said surfaces.

4. The photovoltaic module of claim 3 wherein:
   the reflecting means is a reflective ground surface beneath the module.

5. The photovoltaic module of claim 1 wherein:
   the front electrode is fabricated to attenuate transmission of infrared radiation by the module.

6. The photovoltaic module of claim 5 wherein:
   the front electrode comprises a layer of indium tin oxide.

7. The photovoltaic module of claim 1 wherein:
   at least one of said electrodes comprises a layer of a transparent conductive oxide containing a preselected concentration of an additive to control the conductivity and index of refraction of the layer.

8. The photovoltaic module of claim 1 wherein:
   the back electrode is fabricated to maximize transmission of radiation.

9. The photovoltaic module of claim 8 wherein:
   the back electrode comprises a layer having an index of refraction of at least approximately 1.7 over the solar spectrum.

10. The photovoltaic module of claim 9 wherein:
    the back electrode comprises a layer having an extinction coefficient less than approximately 0.05 over the wavelength range of infrared radiation.

11. The photovoltaic module of claim 1 wherein:
    the front electrode, the semiconductive layer and the back electrode are fabricated to enhance transmission of radiation by the module.

12. The photovoltaic module of claim 11 wherein:
    the semiconductive layer is a thin film silicon-based layer between 1000 and 10,000 angstroms in thickness.

13. The photovoltaic module of claim 12 wherein:

the semiconductive layer is approximately 3,500 angstroms thick.

14. The photovoltaic module of claim 12 wherein:
the semiconductive layer comprises thin film regions of p-type and n-type conductivity on opposite sides of a substantially intrinsic photoconductive region; and both the p-type and the n-type regions are window layers fabricated to transmit radiation within a preselected spectrum to which the photovoltaic region is sensitive.

15. The photovoltaic module of claim 14 wherein:
both the p-type and the n-type regions have band gaps of at least 1.85 electron volts.

16. A photovoltaic module comprising:
a thin film semiconductive layer containing at least one photovoltaic region and having front and back oppositely directed major surfaces;
a transparent front electrode which provides electrical connection to the front surface of the semiconductive layer and transmits incident solar radiation to the semiconductive layer over a preselected spectrum; and
a transparent back electrode which provides electrical connection to the back surface of the semiconductive layer and optically couples the semiconductive layer to the atmosphere to permit transmission by the module of at least a portion of the incident radiation not absorbed by the semiconductive layer;
at least one of said electrodes comprising a layer of a high reflectance metal and a layer of metal oxide, the high reflectance metal layer being directly adjacent to the semiconductive layer.

17. The photovoltaic module of claim 16 wherein:
the metal layer is approximately 50 to 200 angstroms thick; and
the metal oxide layer is approximately 400 to 1000 angstroms thick.

18. The photovoltaic module of claim 16 wherein:
the metal oxide layer has an index of refraction less than 1.7 for infrared radiation.

19. The photovoltaic module of claim 16 wherein:
the metal oxide layer has an index of refraction greater than 1.7 for infrared radiation.

20. The photovoltaic module of claim 16 wherein:
said at least one electrode means comprises an even number of layers alternating between a high reflectance metal and a metal oxide, with one of the high reflectance metal layers being directly adjacent to the semiconductive layer.

21. A photovoltaic module comprising:
a thin film semiconductive layer containing at least one photovoltaic region and having front and back oppositely directed major surfaces;
a transparent front electrode which provides electrical connection to the front surface of the semiconductive layer and transmits incident solar radiation to the semiconductive layer over a preselected spectrum; and
a transparent back electrode which provides electrical connection to the back surface of the semiconductive layer and optically couples the semiconductive layer to the atmosphere to permit transmission by the module of at least a portion of the incident radiation not absorbed by the semiconductive layer;
at least one of said electrodes comprising a thin film composite layer having, in order:
a first transparent conductive oxide layer in electrical contact with the semiconductive film;
a first barrier layer no more than 100 angstroms thick;
a central metallic layer;
a second barrier layer no more than 100 angstroms thick; and
a second transparent conductive layer.

22. The photovoltaic module of claim 21 wherein: the first and second transparent conductive oxide layers comprise ZnO; and the barrier layers comprise $TiO_2$.

23. The photovoltaic module of claim 22 wherein:
the ZnO layers are between 500 and 1500 angstroms thick; and
the $TiO_2$ layers are approximately 50 angstroms thick.

24. The photovoltaic module of claim 22 wherein:
the metallic layer comprises Ag.

25. A photovoltaic module comprising:
a thin film semiconductive layer containing at least one photovoltaic region and having front and back oppositely directed major surfaces;
a transparent front electrode which provides electrical connection to the front surface of the semiconductive layer and transmits incident solar radiation to the semiconductive layer over a preselected spectrum; and
a transparent back electrode which provides electrical connection to the back surface of the semiconductive layer and optically couples the semiconductive layer to the atmosphere to permit transmission by the module of at least a portion of the incident radiation not absorbed by the semiconductive layer;
at least one of said electrodes including a stack of layers comprising, in order:
a first transparent conductive oxide layer in electrical contact with the semiconductive film;
a central layer of an oxide having a refractive index of at least 2.0; and
a second transparent conductive layer.

26. The photovoltaic module of claim 25 wherein:
the first and second transparent conductive oxide layers comprise ITO; and
the central layer comprises $TiO_2$.

27. Combined photovoltaic and solar thermal apparatus comprising:
a photovoltaic module having:
a thin film semiconductor layer containing at least one photovoltaic region and having front and back oppositely directed major surfaces;
a transparent front electrode which provides electrical connection to the front surface of the semiconductive layer and transmits incident solar radiation to the semiconductive layer over a preselected spectrum; and
a transparent back electrode which provides electrical connection to the back surface of the semiconductive layer and optically couples the semiconductive layer to the atmosphere to permit transmission by the module of at least a portion of the radiation not absorbed by the semiconductive layer;
at least one of said electrodes comprising zinc oxide; and
solar thermal apparatus positioned behind the photovoltaic module and spaced therefrom to absorb infrared radiation passed by the photovoltaic module.

28. The apparatus of claim 27 wherein:
said at least one electrode has an index of refraction of at least approximately 1.7 over the solar spectrum.

29. The apparatus of claim 28 wherein:
said at least one electrode has an extinction coefficient less than approximately 0.05 over the wavelength range of infrared radiation.

30. The apparatus of claim 29 wherein:
both of said electrodes comprise zinc oxide.

31. A structure comprising:
a plurality of walls defining an interior volume;
at least one opening in said walls; and
a photovoltaic module over the opening comprising:
  a thin film semiconductive layer containing at least one photovoltaic region and having front and back oppositely directed major surfaces;
  a transparent front electrode which provides electrical connection to the front surface of the semiconductive layer and transmits incident solar radiation to the semiconductive layer over a preselected spectrum; and
  a transparent back electrode which provides electrical connection to the back surface of the semiconductive layer and optically couples the semiconductive layer to the atmosphere to permit transmission by the module of at least a portion of the radiation not absorbed by the semiconductive layer;
one of said electrodes comprising zinc oxide.

32. The structure of claim 31 wherein:
the other of said electrodes is fabricated to attenuate transmission of infrared radiation by the module.

33. the structure of claim 32 wherein:
the thin film semiconductive layer comprises an amorphous silicon-containing layer;
said other electrode comprises tin oxide.

34. The structure of claim 32 wherein:
the structure is an automobile having a sunroof;
the opening in said walls is closed by the sunroof; and
the photovoltaic module is disposed within the sunroof to convert incident radiation falling within a first portion of the solar spectrum to electricity and transmit visible light radiation falling within a second portion of the solar spectrum to the interior of the automobile.

35. The structure of claim 32 wherein:
the structure is a vessel for navigation on water and has a hatch cover;
the opening in said walls is closed by the hatch cover; and
the photovoltaic module is disposed within the hatch cover to convert incident radiation falling within a first portion of the solar spectrum to electricity and transmit visible light radiation falling within a second portion of the solar spectrum to the interior of the vessel.

36. The structure of claim 32 wherein:
the structure is a building;
the opening in the walls is a window opening; and
the photovoltaic module is disposed within the window opening to convert incident light falling within a first portion of the solar spectrum to electricity and act as a window to transmit radiation falling within a second portion of the solar spectrum to the interior of the building.

37. In the manufacture of photovoltaic modules having a thin film semiconductive layer containing at least one photovoltaic region and having front and back oppositely directed major surfaces; a transparent front electrode which provides electrical connection to the front surface of the semiconductive layer and transmits incident solar radiation to the semiconductive layer over a preselected spectrum; and a transparent back electrode which establishes electrical connection to the back surface of the semiconductive layer and optically couples the semiconductive layer to the atmosphere to permit transmission by the module of at least a portion of the radiation not absorbed by the semiconductive layer; the method of controlling the transmission of radiation by the module comprising the steps of:
fabricating one of said electrodes of zinc oxide having an index of refraction greater than 1.7 for infrared radiation.

38. The method of claim 37 wherein:
transmission of visible light radiation by the module is controlled by controlling the index of refraction, extinction coefficient, transparency and the thickness of the electrodes.

39. The method of claim 38 wherein:
the transmission of visible light radiation is further controlled by including additives in the material of one of the electrodes to increase its conductivity and reduce its index of refraction.

40. A method of utilizing a thin film photovoltaic module to filter solar radiation entering a structure having a plurality of walls defining an interior volume, comprising the steps of:
providing the photovoltaic module with a transparent front electrode at a radiation-incident side of the module and a transparent back electrode containing zinc oxide at an opposite side of the module; and
positioning the module over an opening in said walls to convert radiation within a first portion of the spectrum of incident solar radiation into electricity and pass radiation within a second portion of said spectrum to the interior of the structure for non-photovoltaic use.

* * * * *